United States Patent [19]

Marvakov et al.

[11] Patent Number: 4,628,427
[45] Date of Patent: Dec. 9, 1986

[54] D.C. IMPULSE ARC WELDER EMPLOYING THYRISTORS

[75] Inventors: Ivan K. Marvakov; Todor Y. Russev, both of Sofia, Bulgaria

[73] Assignee: ZNIKA, Sofia, Bulgaria

[21] Appl. No.: 743,262

[22] Filed: Jun. 7, 1985

Related U.S. Application Data

[63] Continuation of Ser. No. 493,004, May 9, 1983, abandoned.

[51] Int. Cl.[4] ........................ H03K 3/53; B23K 9/10
[52] U.S. Cl. ................................ 363/27; 307/108; 219/130.51
[58] Field of Search .......................... 363/27, 28, 135; 307/107, 108; 219/121 EA, 130.1, 130.51, 69 C, 69 P; 315/209 SC

[56] References Cited

U.S. PATENT DOCUMENTS

| | | | |
|---|---|---|---|
| 3,474,214 | 10/1969 | Ferguson | 363/27 |
| 4,009,365 | 2/1977 | Kaley et al. | 219/130.51 |
| 4,048,468 | 9/1977 | Maule | 219/130.1 |

FOREIGN PATENT DOCUMENTS

| | | | |
|---|---|---|---|
| 91023 | 6/1982 | Japan | 307/108 |
| 91024 | 6/1982 | Japan | 307/108 |

Primary Examiner—Peter S. Wong

[57] ABSTRACT

Apparatus for producing an impulse welding current which can be used in shielded-arc welding. The apparatus includes a thyristor connector in a series circuit to a primary winding of an impulse transformer and a second thyristor and a compacitor, the secondary winding of the impulse transformer being connected to a diode to the welding arc. The apparatus increases the coefficient of the impulse welding current and reduces the steepness of the positive fronts of the voltage imposed upon the thyristors.

4 Claims, 4 Drawing Figures

D.C. IMPULSE ARC WELDER EMPLOYING THYRISTORS

This is a continuation of application Ser. No. 493,004, filed May 9, 1983, now abandoned.

This invention relates to an apparatus for producing an impulse welding current which can be used in shielded-arc welding.

A known apparatus (Bulgarian Author's Certificate No. 32453) comprises a current supply, a capacitor to which there are connected a first thyristor and the primary winding of an impulse transformer, parallel to which there is connected a second thyristor. The secondary winding of the impulse transformer is connected through a diode to the welding arc. Between the common point of the first and second thyristors and the primary winding of the impulse transformer there is included a capacitor, and parallel to the second thyristor there is connected a diode.

A drawback of this known apparatus lies in its relatively low duty cycle (coefficient of current volume) of the impulse welding current, and the very steep positive fronts of growth of the voltage on the thyristors, which can lead to their arbitrary switching. It is therefore a general object of the present invention to provide an apparatus which is particularly characterized by its increased coefficient of current amount of volume of the impulse welding current, and the reduced steepness of the positive fronts of the voltage imposed upon the thyristors.

The above object is achieved by an apparatus for producing an impulse welding current in accordance with the invention. The apparatus of the present invention comprises a first thyristor, connected to the one pole of a constant D.C. voltage source of current and a closed series loop, said loop comprising a capacitor, a second thyristor and the primary winding of an impulse transformer. The secondary winding of the impulse transformer is connected through a diode to the welding arc. A first choke is connected between the first thyristor and the common point of the capacitor and the second thyristor, and the common point of the primary winding of the impulse transformer and the capacitor is connected to the other pole of the D.C. voltage source. Parallel to the capacitor there is connected a series circuit made up of a second choke and a third thyristor.

The apparatus of the invention also includes an alternative construction which is produced by short-circuiting the common point between the first thyristor and the first choke with the common point between the third thyristor and the second choke, the two parallel chokes employed in the first described embodiment being replaced by one common choke.

In a still further embodiment of the apparatus according to the invention between the capacitor and the third thyristor there is included a fourth thyristor, the common point of the capacitor and the fourth thyristor and the common point of the first thyristor and the supply source being connected by a fifth thyristor, and between the primary winding of the impulse transformer and the capacitor there is connected a sixth thyristor; between the common point of the second thyristor and the primary winding of the impulse transformer and the common point of the capacitor and the sixth thyristor there is connected a seventh thyristor, between the common point of the capacitor and the second thyristor and the common point of the sixth thyristor and the primary winding of the impulse transformer there is connected an eighth thyristor.

The advantages of the apparatuses according to the invention lie in that they possess a higher duty cycle (coefficient of fullness or volume) of the impulse welding current, and that with them there are avoided the steep positive fronts of the voltage imposed upon the thyristors.

For a better understanding of the invention, reference should be had to the accompanying drawings in which there are illustrated and described a number of preferred embodiments of the invention.

Figure 1:
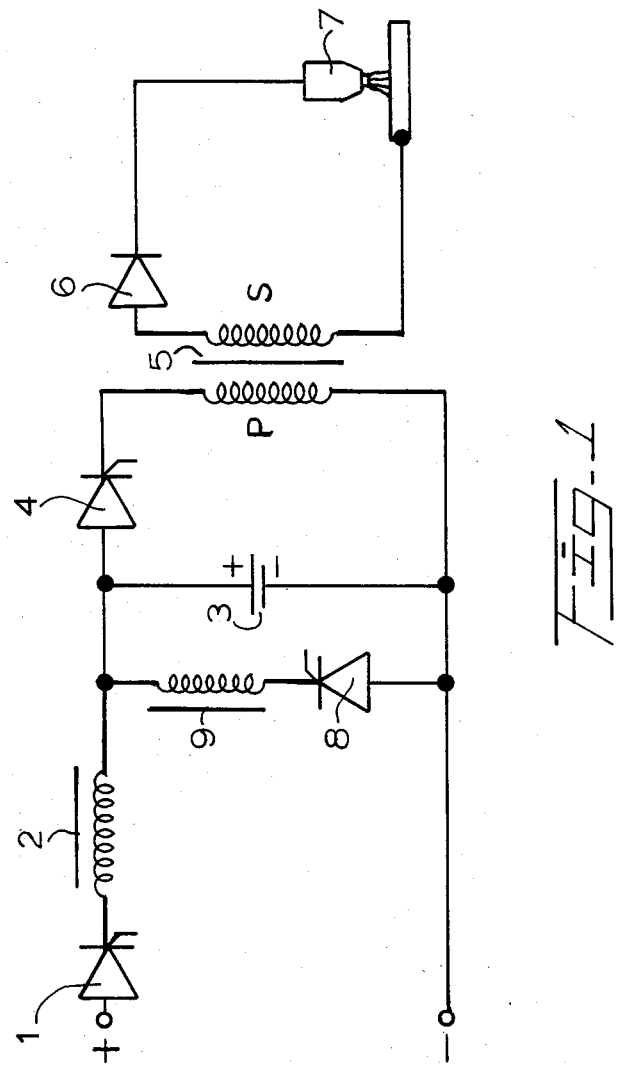
FIG. 1 is a circuit diagram of a first preferred embodiment of the apparatus of the invention.

Turning first to FIG. 1, to the positive pole of a source of supply of D.C. voltage (not shown) there is connected the anode of a first thyristor 1, the cathode of such first thyristor being connected through a first choke 2 and a capacitor 3 to the negative pole of the voltage supply. To the common point of the first choke 2 and the capacitor 3 there is connected the anode of a second thyristor 4, the cathode of which is connected through the primary winding P of an impulse transformer 5 to the negative pole of the source of D.C. voltage. The secondary winding S of the impulse transformer 5 is connected through a diode 6 to the welding arc 7. The anode of a third thyristor 8 is connected to the negative pole of the supply voltage, while the cathode of thyristor 8 is connected to a second choke 9 to the common point of the first choke 2, the capacitor 3 and the anode of the second thyristor 4.

The apparatus of FIG. 1 operates as follows:

Upon the switching on of thyristor 1, the capacitor 3 is charged through it and the choke 2 by the source of D.C. voltage connected to the terminals labeled plus and minus, respectively. After the charging of capacitor 3 has terminated, and thyristor 1 is switched off, thyristor 4 is switched on and through it the capacitor 3 is discharged through the primary winding P of the impulse transformer 5. Thereupon, through the secondary winding S of the impulse transformer 5, the diode 6, and the welding arc 7 there passes a current impulse. As a result of the inductance of the impulse transformer 5, part of the energy of the capacitor 3 returns by an oscillatory process to the capacitor 3 and recharges it with a reverse polarity. At the end of the recharging of capacitor 3 and the switching off of thyristor 4, the thyristor 8 is switched on.

A loop is thus produced, said loop comprising the thyristor 8, the choke 9, and the capacitor 3, the capacitor 3 being discharged and recharged with its initial polarity to a voltage which is lower than that of the voltage supply source. Since the recharging loop is independent of the transformer and its relatively great inductance, with an appropriate dimensioning of choke 9 the process is carried out comparatively quickly. There then follows a new switching on of thyristor 1, and with that the capacitor 3 is charged up through the choke 2, and the aforedescribed process is repeated. The thyristor 1 may be switched on after the end of recharging capacitor 3 through thyristor 8 and choke 9, or thyristor 1 may be switched on at a preset moment during the process of recharging capacitor 3. The voltage to which capacitor 3 will be charged will be higher when thyristor 1 is switched early than it will be if thyristor 1 is switched later. The presence of a separate choke in the circuits of both thyristors 1 and 8 allows the switching on of thyristor 1 during the process of recharging capacitor 3 through thyristor 8, without the occurrence of inadmissibly high steepness of increase of the current through the thyristor 1.

The interrelations between the components of the circuit allow the avoidance of steep positive fronts of increase of the voltage on the thyristors, since when one or the other of the thyristors 1 and 8 are switched on, on the other thyristor there will occur an increase of the voltage in the negative and not in the positive direction. Moreover, when switching on any of the three thyristors 1, 4, and 8, both chokes 2 and 9 and the capacitor 3 restrict the steepness of the voltages on the remaining two thyristors to very low magnitudes.

Figure 2:
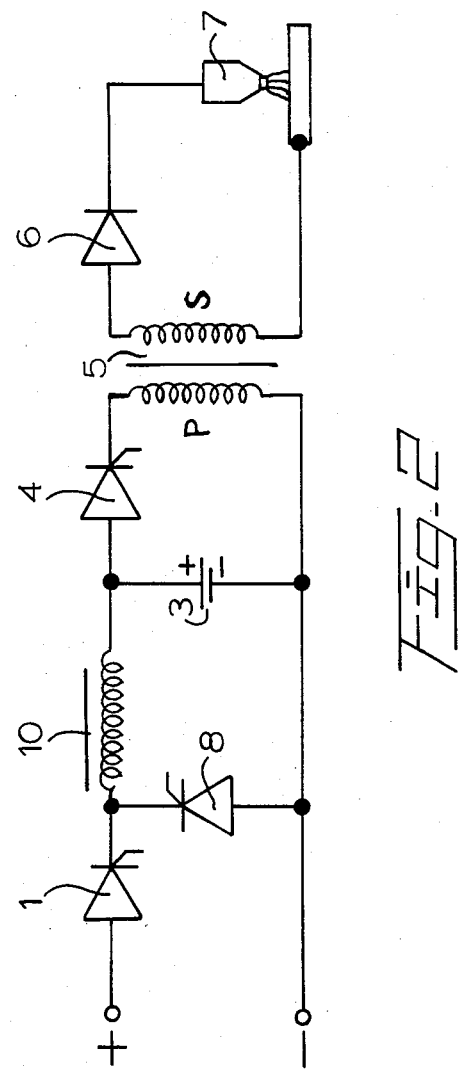
FIG. 2 is a circuit diagram of a second preferred embodiment of the apparatus of the invention.

FIG. 2 illustrates a second preferred embodiment of the apparatus of the invention. Parts in the circuit of FIG. 2 which are the same as those in FIG. 1 are designated by the same reference characters as those employed in FIG. 1. The circuit of FIG. 2 differs from that of FIG. 1 in that the common point between the first thyristor 1 and the first choke 2 of FIG. 1, and the common point between the third thyristor 8 and the second choke 9 of FIG. 1 are short-circuited in FIG. 2, and that chokes 2 and 9 of FIG. 1 are replaced by a common choke 10 which is connected between the common point of thyristors 1 and 8 and the positive labeled terminal of capacitor 3.

The manner of operation of the apparatus of FIG. 2 is similar to that of the apparatus illustrated in FIG. 1 in the condition wherein the thyristor 1 is switched on only after the current through thyristor 8 passes through zero. In this case, it is not necessary to employ separate chokes in the circuits of both thyristors 1 and 8, and it is sufficient to employ only one choke 10. It is obvious that this apparatus is simpler than that of FIG. 1, but it can be used only on condition that the regulation of the amplitude of the output impulses from the secondary S of transformer 5 is not necessary.

Figure 3:
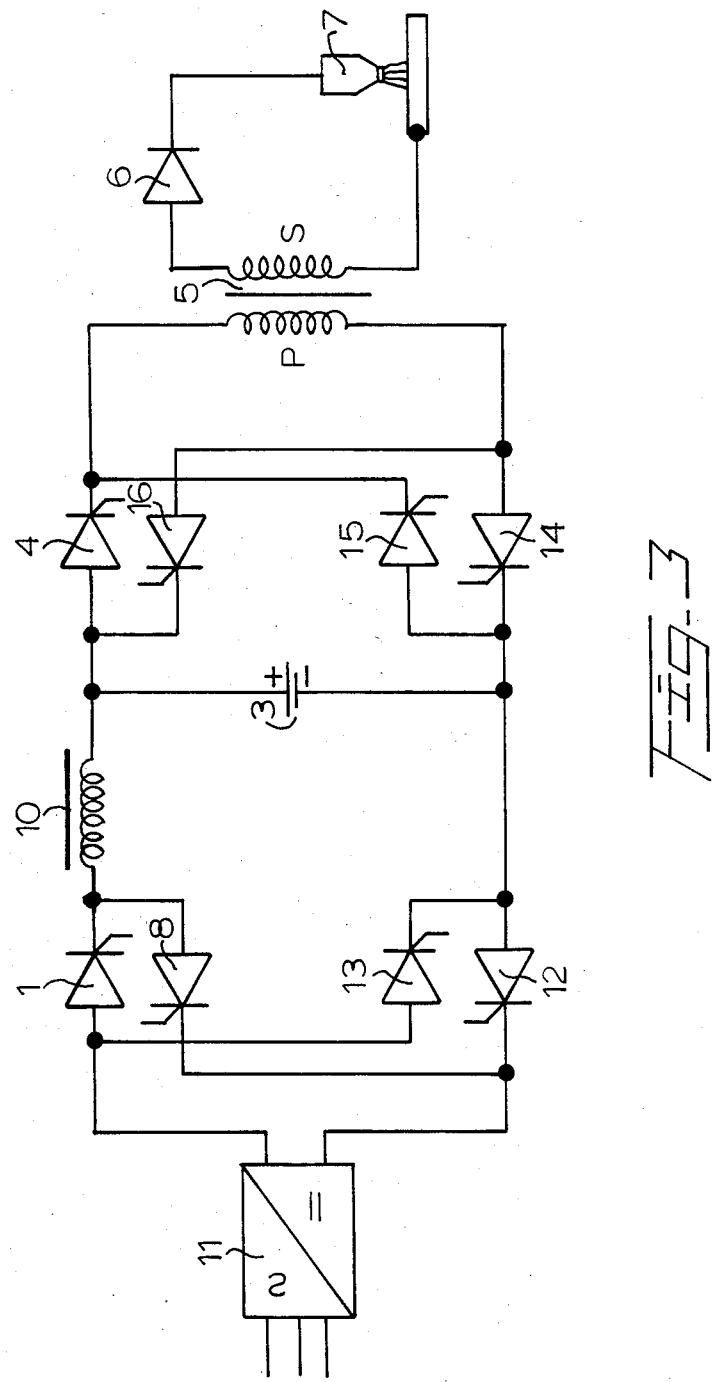
FIG. 3 is a circuit diagram of a third preferred embodiment of the apparatus of the invention.

A third preferred embodiment of the apparatus of the invention is shown in FIG. 3. Parts in the circuit of FIG. 3 which are similar to those employed in the circuits of FIGS. 1 and 2 are designated by the same reference characters as in such prior figures. In the circuit of FIG. 3, between the outlets of a supply current rectifier 11 there is connected a series circuit made up of a first thyristor 1, and choke 10, a capacitor 3, and a fourth thyristor 12. Between the common point of the first thyristor 1 and the supply current rectifier 11 and the common point of capacitor 3 and the fourth thyristor 12 there is connected a fifth thyristor 13. Between the common point of the first thyristor 1 and the choke 10 and the common point of the fourth thyristor 12 and the current rectifier 11 there is connected a third thyristor 8. Parallel to capacitor 3 there is connected a circuit made up of a second thyristor 4, the primary winding P of impulse transformer 5, and a sixth thyristor 14, while a seventh thyristor 15 is connected between the common point of capacitor 3 and the sixth thyristor 14 and the common point of the second thyristor 4 and the primary winding P of the impulse transformer 5. Between the common point of the primary winding P of the impulse transformer 5 and the sixth thyristor 14 and the common point of capacitor 3 and the second thyristor 4 there is connected an eighth thyristor 16. The secondary winding S of the impulse transformer 5 is connected through a diode 6 to the welding arc 7.

The apparatus for FIG. 3 operates as follows:

When thyristors 1 and 12 are switched on, the capacitor 3 is charged by the current rectifier 11 with the polarity indicated in FIG. 3 through the switched-on thyristors 1 and 12 and the choke 10. After the charging of capacitor 3 is ended, and thyristors 1 and 12 are switched off, thyristors 4 and 14 are switched on and at that time the capacitor 3 is discharged through the switched-on thyristors 4 and 14 and the primary winding P of the impulse transformer 5. At that time, a current impulse passes through the secondary winding S of the impulse transformer 5, the diode 6 and the welding arc 7. Because of the inductance of the welding transformer 5, after the discharge, capacitor 3 is recharged to a preset lower voltage with a polarity which is the reverse of that indicated in FIG. 3.

After the recharging has ended, and thyristors 4 and 14 are switched off, thyristors 8 and 13 are switched on. Through them and through choke 10, the capacitor 3 is recharged from the current recifier 11 with a polarity which is the reverse of that shown in FIG. 3. After switching on the thyristors 15 and 16, the capacitor 3 is again discharged through the primary winding P of the impulse transformer 5, and the direction of the discharge current remains the same with respect to the latter as when the thyristors 4 and 14 are switched on. Through the secondary winding S of the impulse trasformer 5, the diode 6, and the welding arc 7, there again passes an impulse current. After the end of discharging and recharging the capacitor 3 to a present voltage with the polarity which is the same as that indicated in FIG. 3, there are again switched on the four pairs of thyristors in the described sequence and the above-described process is repeated.

The switching on of thyristors 1 and 12, and the switching on of thyristors 8 and 13, respectively, can also be effected before the preceding process of discharging the capacitor 3 through the impulse transformer 5 has ended. In this case, depending on the moment of switching on, there will be obtained a different final voltage of recharging of the capacitor 3, and a respectively different amplitude of the welding current impulses. The determination of the moment of switching on of the thyristors 1 and 12 can be effected by checking the time from the moment of switching on the preceding pair of thyristors 15 and 16, or when the voltage of capacitor 3 reaches a preset voltage during the process of its recharging. This is also valid for thyristors 8 and 13. Thus, it is possible to regulate the amplitude of the impulse welding current in a ratio of 1:2 or more. At that, with the increase of the amplitude of the impulse welding current there also increases the limit frequency of discharge for the stable operation of the apparatus.

Figure 4:
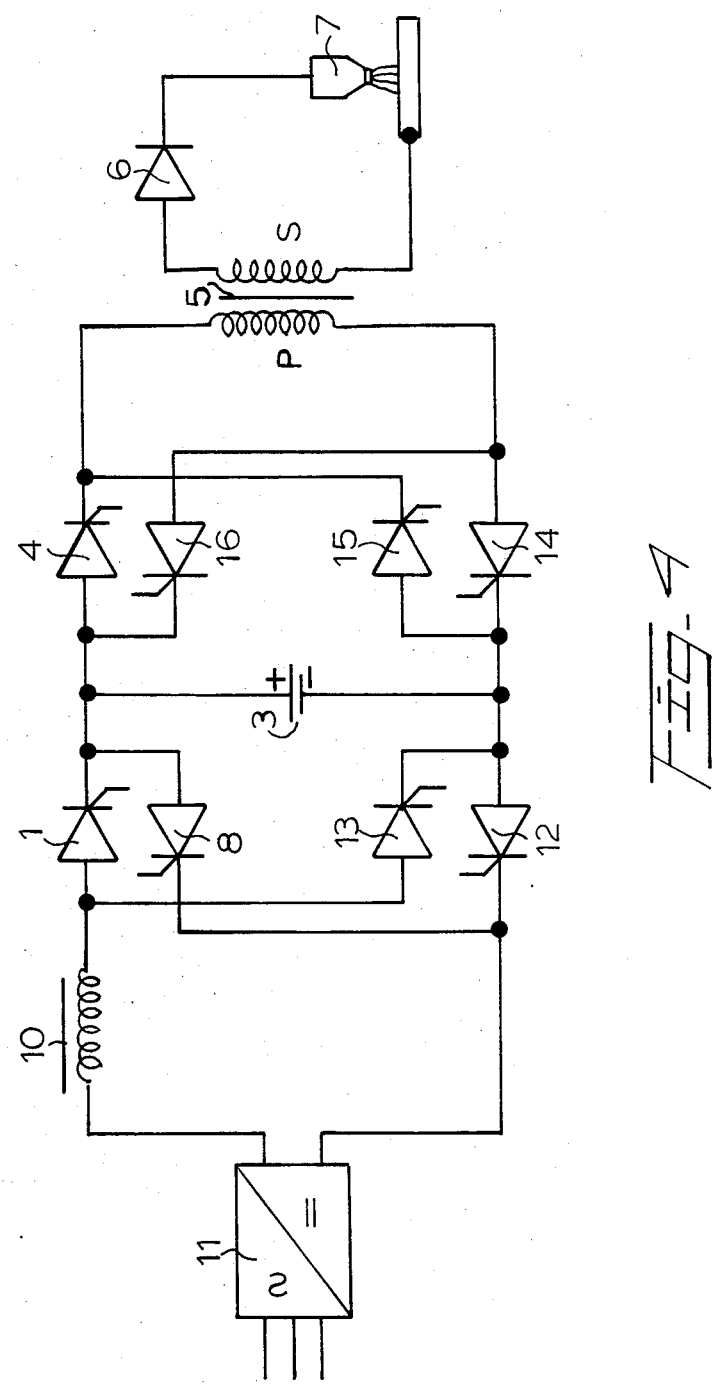
FIG. 4 is a circuit diagram of a fourth preferred embodiment of the apparatus of the invention.

In FIG. 4 there is shown a fourth embodiment of the apparatus of the invention. Such apparatus represents a variation of that shown in FIG. 3; parts shown in the circuit of FIG. 4 which are the same as those in FIG. 3 are designated by the same reference characters as in FIG. 3.

The difference between the circuits of FIGS. 3 and 4 lies in the facts that the common point of the first thyristor 1 and the third thyristor 8 of FIG. 3 and the common point of capacitor 3, the second thyristor 4, and the eighth thyristor 16 of FIG. 3 are short-circuited in FIG.

4, and the choke 10 of FIG. 3 is included between the one pole of the supply current rectifier 11 and the common point of the first thyristor 1 and the fifth thyristor 13 in the circuit of FIG. 4. The manner of operation of the circuit of FIG. 4 is the same as that abovedescribed in connection with FIG. 3, and so no specific description of the manner of operation of the circuit of FIG. 4 is necessary.

In the apparatuses of the embodiments of FIGS. 3 and 4 there is not involved the process of reverse charging of the capacitor 3, as in the apparatuses of FIGS. 1 and 2. Consequently, the duty cycle (coefficient of fullness) of current impulses delivered by the circuits of FIGS. 3 and 4 is from 25% to 30% higher than that achieved with the circuits of FIGS. 1 and 2.

Although the invention is described and illustrated with reference to a plurality of embodiments thereof, it is to be expressly understood that it is in no way limited to the disclosure of such preferred embodiments but is capable of numerous modifications within the scope of the appended claims.

We claim:

1. In an apparatus for producing an impulse welding current, comprising a source of direct current having a constant voltage, a first thyristor connected to one of the poles of said current supply source, a closed series loop which comprise a capacitor, a second thyristor, and the primary winding of an impulse transformer, the second winding of the impulse transformer being adapted to be connected through a diode to a welding arc, the improvement wherein a third thyristor is connected in parallel to the capacitor, and between the first thyristor and the common point of the capacitor and the second thyristor there is connected a first choke, a second choke is connected in series with the third thyristor and the common point of the capacitor, the second thyristor and the first choke, and the common point of the primary winding of the impulse transformer and the capacitor is connected to the other pole of the constant voltage current supply source.

2. In an apparatus for producing an impulse welding current, comprising a source of direct current having a constant voltage, a fist thyristor connected to one of the poles of said current supply source, a closed series loop which comprises a capacitor, a second thyristor, and the primary winding of an impulse transformer, the secondary winding of the impulse transformer being adapted to be connected through a diode to a welding arc, the improvement wherein a third thyristor is connected in parallel to the capacitor, between the first thyristor and the common point of the capacitor and the second thyristor there is connected a common choke, and the common point of the primary winding of the impulse transformer and the capacitor is connected to the other pole of the constant voltage current supply source, between the capacitor and the third thyristor there is included a fourth thyristor, and between the common point of the capacitor and the fourth thyristor and the common point of the first thyristor and the current supply source there is connected a fifth thyristor, and between the primary winding of the impulse transformer and the capacitor there is included a sixth thyristor, and between the common point of the second thyristor and the primary winding of the impulse transformer and the common point of the capacitor and the sixth thyristor there is included a seventh thyristor, while between the common point of the capacitor and the second thyristor and the common point of the sixth thyristor and the primary winding of the impulse transformer there is included an eighth thyristor.

3. In an apparatus for producing an impulse welding current, comprising a source of direct current having constant voltage, a first thyristor connected in a series circuit to a primary winding of the an impulse transformer, and a second thyristor and a capacitor, the secondary winding of the impulse transformer being connected through a diode to the welding arc, the improvement wherein between the first thyristor and the primary winding of the impulse transformer there are connected in series a choke and a second thyristor, and between the common point of the choke and the second thyristor and the negative pole of the direct current source there is connected a capacitor and a third thyristor is connected between the common point of the first thyristor and the choke and the negative pole of the direct current source.

4. An apparatus for producing a impulse welding current according to claim 3, wherein between the capacitor and the third thyristor there is included a fourth thyristor, and between the common point of the capacitor and the fourth thyristor and the common point of the first thyristor and the current supply source there is connected a fifth thyristor, and between the primary winding of the impulse transformer and the capacitor there is included a sixth thyristor, and between the common point of the second thyristor and the primary winding of the impulse transformer and the common point of the capacitor and the sixth thyristor there is include a seventh thyristor, while between the common point of the capacitor and the second thyristor and the common point of the sixth thyristor and the primary winding of the impulse transformer there is included an eight thyristor.

* * * * *

UNITED STATES PATENT AND TRADEMARK OFFICE
CERTIFICATE OF CORRECTION

PATENT NO. : 4,628,427
DATED : December 9, 1986
INVENTOR(S) : Ivan Kirilov MARVAKOV, ET AL.

It is certified that error appears in the above-identified patent and that said Letters Patent are hereby corrected as shown below:

Please add the name of the third-named inventor:

Kostadin Zikov ZIKOV

Signed and Sealed this

Eighth Day of September, 1987

*Attest:*

DONALD J. QUIGG

*Attesting Officer*      *Commissioner of Patents and Trademarks*